United States Patent
Saxod et al.

(10) Patent No.: US 10,833,208 B2
(45) Date of Patent: Nov. 10, 2020

(54) METHOD FOR MANUFACTURING A COVER FOR AN ELECTRONIC PACKAGE AND ELECTRONIC PACKAGE COMPRISING A COVER

(71) Applicant: STMicroelectronics (Grenoble 2) SAS, Grenoble (FR)

(72) Inventors: Karine Saxod, Les Marches (FR); Alexandre Mas, Saint Egreve (FR); Eric Saugier, Froges (FR); Gaetan Lobascio, Moirans (FR); Benoit Besancon, Villard Bonnot (FR)

(73) Assignee: STMicroelectronics (Grenoble 2) SAS, Grenoble (FR)

( * ) Notice: Subject to any disclaimer, the term of this patent is extended or adjusted under 35 U.S.C. 154(b) by 0 days.

(21) Appl. No.: 16/581,978

(22) Filed: Sep. 25, 2019

(65) Prior Publication Data
US 2020/0020815 A1    Jan. 16, 2020

Related U.S. Application Data

(62) Division of application No. 15/689,976, filed on Aug. 29, 2017, now Pat. No. 10,483,408.

(30) Foreign Application Priority Data

Jan. 3, 2017    (FR) ..................... 17 50051

(51) Int. Cl.
*H01L 31/0203*    (2014.01)
*H01L 31/0232*    (2014.01)
(Continued)

(52) U.S. Cl.
CPC .... *H01L 31/0203* (2013.01); *B29C 45/14065* (2013.01); *B29C 45/14639* (2013.01);
(Continued)

(58) Field of Classification Search
CPC ........ B29C 45/14065; B29C 45/14639; B29C 45/14778; H01L 31/02002; H01L 31/0203;
(Continued)

(56) References Cited

U.S. PATENT DOCUMENTS 5,695,847 A    12/1997 Browne
5,705,851 A    1/1998 Mostafazadeh et al.
(Continued)

FOREIGN PATENT DOCUMENTS

DE    102005032664 A1    1/2007
EP    2758908 A1    7/1998
(Continued)

OTHER PUBLICATIONS

INPI Search Report and Written Opinion for FR 1750051 dated Oct. 16, 2017 (8 pages).

*Primary Examiner* — Long K Tran
(74) *Attorney, Agent, or Firm* — Crowe & Dunlevy

(57) ABSTRACT

A cover for an electronic package is manufactured by placing an optical insert, having opposite faces and configured to allow light radiation to pass therethrough, between two opposite faces of a cavity of a mold in a position such that said optical faces of the optical insert make contact with said opposite faces of the cavity of the mold. A coating material is injected into the cavity and around the optical insert. The coating material is set to obtain a substrate that is overmolded around the optical insert so as to produce the cover. An electronic package includes an electronic chip mounted to a support substrate with the cover formed by the overmolded substrate mounted to the support substrate.

12 Claims, 5 Drawing Sheets

(51) Int. Cl.
  *H01L 31/18* (2006.01)
  *H01L 31/02* (2006.01)
  *H01L 31/12* (2006.01)
  *B29C 45/14* (2006.01)
  *H01L 33/48* (2010.01)
  *B29L 31/34* (2006.01)

(52) U.S. Cl.
  CPC .. *H01L 31/02002* (2013.01); *H01L 31/02325* (2013.01); *H01L 31/02327* (2013.01); *H01L 31/12* (2013.01); *H01L 31/18* (2013.01); *H01L 33/483* (2013.01); *B29C 45/14778* (2013.01); *B29K 2995/0026* (2013.01); *B29L 2031/3481* (2013.01)

(58) Field of Classification Search
  CPC ......... H01L 31/02325; H01L 31/02327; H01L 31/12; H01L 31/18; H01L 33/483
  USPC .......................................... 257/704, 731, 735
  See application file for complete search history.

(56) References Cited

U.S. PATENT DOCUMENTS

| | | |
|---|---|---|
| 5,766,535 A | 6/1998 | Ong |
| 6,306,685 B1 | 10/2001 | Liu et al. |
| 6,353,257 B1 | 3/2002 | Huang |
| 6,414,385 B1 | 7/2002 | Huang et al. |
| 6,498,099 B1 | 12/2002 | McLellan et al. |
| 7,242,068 B2 | 7/2007 | Huang |
| 7,732,914 B1 | 6/2010 | McLellan et al. |
| 7,749,882 B2 | 7/2010 | Kweon et al. |
| 7,906,857 B1 | 3/2011 | Hoang et al. |
| 8,946,883 B2 | 2/2015 | Kim et al. |
| 9,472,692 B2 | 10/2016 | Sorrieul et al. |
| 9,773,740 B2 | 9/2017 | Saxod et al. |
| 9,818,664 B2 | 11/2017 | Besancon et al. |
| 9,870,947 B1 | 1/2018 | Campos et al. |
| 10,147,834 B2 | 12/2018 | Herard et al. |
| 2002/0195701 A1 | 12/2002 | Bemmerl et al. |
| 2003/0042596 A1 | 3/2003 | Crane, Jr. et al. |
| 2004/0082114 A1 | 4/2004 | Horng |
| 2004/0148772 A1 | 8/2004 | Hsieh et al. |
| 2005/0026418 A1 | 2/2005 | Egawa et al. |
| 2005/0044618 A1 | 3/2005 | Shimizu et al. |
| 2005/0161755 A1 | 7/2005 | Huang et al. |
| 2006/0220210 A1 | 10/2006 | Kamezos et al. |
| 2008/0057622 A1 | 3/2008 | Fan |
| 2009/0001532 A1 | 1/2009 | Shiomi |
| 2009/0086449 A1 | 4/2009 | Minamio et al. |
| 2009/0261468 A1 | 10/2009 | Kroeninger et al. |
| 2010/0308453 A1 | 12/2010 | Scheid et al. |
| 2010/0314743 A1 | 12/2010 | Li |
| 2011/0049531 A1 | 3/2011 | Oka et al. |
| 2012/0104454 A1 | 5/2012 | Coffy |
| 2012/0146243 A1 | 6/2012 | Song et al. |
| 2013/0079068 A1 | 3/2013 | Coffy et al. |
| 2014/0061447 A1 | 3/2014 | Campbell et al. |
| 2015/0227829 A1 | 8/2015 | Finn et al. |
| 2015/0243616 A1 | 8/2015 | Hu et al. |
| 2016/0136851 A1 | 5/2016 | Campbell et al. |
| 2017/0127567 A1 | 5/2017 | Besancon et al. |
| 2017/0141241 A1 | 5/2017 | Yu et al. |
| 2017/0170154 A1 | 6/2017 | Ryu et al. |
| 2017/0200646 A1 | 7/2017 | Nakka et al. |
| 2018/0058920 A1 | 3/2018 | Saxod et al. |
| 2018/0117813 A1 | 5/2018 | Ho et al. |
| 2018/0190511 A1 | 7/2018 | Mas et al. |
| 2018/0190512 A1 | 7/2018 | Besancon et al. |
| 2018/0190562 A1 | 7/2018 | Figuiere et al. |
| 2018/0190838 A1 | 7/2018 | Saxod et al. |
| 2018/0337104 A1 | 11/2018 | Sorrieul |
| 2019/0027381 A1 | 1/2019 | Kadoguchi et al. |
| 2019/0027416 A1 | 1/2019 | Saxod et al. |

FOREIGN PATENT DOCUMENTS

| | | |
|---|---|---|
| EP | 2448001 A2 | 10/2011 |
| FR | 2835654 A1 | 8/2003 |
| JP | S5818223 A | 2/1983 |

METHOD FOR MANUFACTURING A COVER FOR AN ELECTRONIC PACKAGE AND ELECTRONIC PACKAGE COMPRISING A COVER

CROSS REFERENCE TO RELATED APPLICATIONS

This application is a divisional from U.S. patent application Ser. No. 15/689,976 filed Aug. 29, 2017, which claims the priority benefit of French Application for Patent No. 1750051, filed on Jan. 3, 2017, the disclosures of which are hereby incorporated by reference in their entireties.

TECHNICAL BACKGROUND

The present invention relates to the field of electronic packages, in particular to those which comprise electronic chips including light radiation emitters and/or light radiation sensors.

BACKGROUND

It is known practice to produce electronic packages which comprise electronic chips provided with integrated optical elements, light radiation sensors and/or emitters, mounted on carrier substrates and which comprise encapsulation covers for the chips, which covers are mounted on the carrier substrates. These covers are provided with optical members, generally made of glass, which allow light to pass through, which members are transferred onto the covers after the latter have been mounted on carrier substrates and are fixed to the covers by way of layers of adhesive.

SUMMARY

According to one embodiment, a method is proposed for manufacturing at least one encapsulation cover for an electronic package, comprising the following steps: placing at least one optical insert, having opposite faces and allowing light radiation to pass therethrough, between two opposite faces of a cavity of a mold in a position such that said faces of the optical insert make contact with said faces of said cavity of the mold; injecting a coating material into said cavity, around said optical insert; and setting the coating material in order to obtain a substrate that is overmolded around said optical insert, so as to produce at least one cover comprising at least one optical insert and at least a portion of said overmolded substrate. The method may comprise a later step of cutting through said overmolded substrate and at a distance from said optical insert.

The mold may comprise opposite layers made of a compressible material at least partly forming said faces of said cavity, said opposite faces of said optical insert bearing on these layers.

Said opposite faces of the mold may be parallel.

One of said faces of the cavity of the mold may comprise at least one zone surrounded by at least one groove, one of the faces of the optical insert making contact above this zone, such that said substrate of the obtained cover is provided with at least one protruding rib corresponding to said groove of the mold.

The method may comprise a later cutting step carried out through said protruding rib.

One of said faces of the cavity of the mold may comprise at least two zones surrounded by at least one main protruding groove and separated by at least one intermediate groove, optical inserts having faces making contact above said zones, such that said substrate of the obtained cover is provided with at least one peripheral protruding rib corresponding to said main groove of the mold and at least one intermediate rib corresponding to said intermediate groove of the mold.

The method may comprise a later cutting step carried out through said main protruding rib.

Said intermediate groove may have a shallower part, such that said substrate of the obtained cover is provided with an intermediate rib having a notch corresponding to said intermediate groove of the mold.

An electronic package is also proposed which comprises: a carrier substrate; at least one electronic chip having a back face fixed to a front mounting face of the carrier substrate and provided with at least one optical element integrated within its front face; and an encapsulation cover of said chip, comprising a substrate that is overmolded around an optical insert allowing light radiation to pass from one side of the overmolded substrate to the other, said cover being fixed at least above said carrier substrate.

Said cover may be fixed above said carrier substrate by way of an annular bead of adhesive or an annular strip of adhesive, interposed between a peripheral zone of the carrier substrate and a peripheral zone of said overmolded substrate.

Said overmolded substrate may be provided with a ring-shaped rib surrounding said chip at a distance, the cover being fixed above said carrier substrate by way of a strip of adhesive interposed between said carrier substrate and said ring-shaped rib.

Said overmolded substrate may be provided with an intermediate rib delimiting two chambers, this intermediate rib being fixed on top of said carrier substrate by way of a strip of adhesive.

The carrier substrate may be provided with two electronic chips located in said chambers, respectively.

The carrier substrate may be provided with an electronic chip that extends through a notch of said intermediate rib, this intermediate rib being fixed on said chip by way of a strip of adhesive.

Said electronic chip may be provided with two optical sensors located on either side of said intermediate rib.

The carrier substrate may be provided with another electronic chip provided with an optical transmitter.

Said overmolded substrate may be provided with two optical inserts located on either side of said intermediate rib.

A cover for an electronic package is also proposed which comprises an optical insert having opposite faces, made of a material that allows light radiation to pass through from one face to the other, and a substrate, made of an opaque coating material, overmolded around the insert such that said opposite faces of the insert are at least partly uncovered.

Said overmolded substrate may be provided, as a single part, with a ring-shaped rib that surrounds at a distance from and protrudes with respect to one of said opposite faces of said insert.

BRIEF DESCRIPTION OF THE DRAWINGS

Electronic packages and modes of manufacture of these packages will now be described by way of non-limiting examples, which are illustrated by the appended drawings in which.

DETAILED DESCRIPTION

Figure 1:
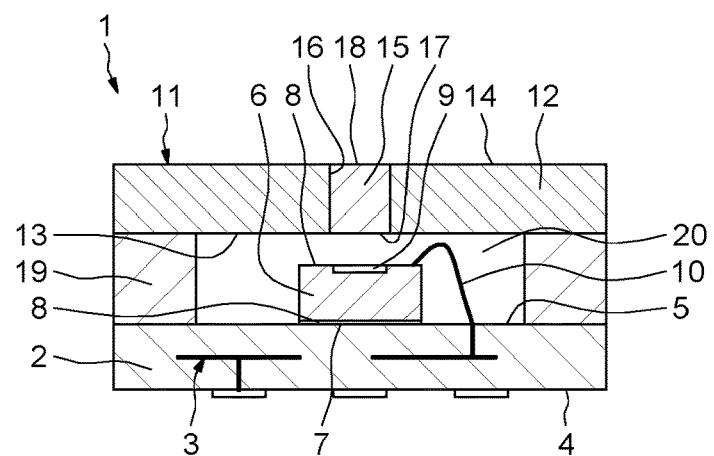
FIG. 1 shows a cross section of an electronic package.

FIG. 1 illustrates an electronic package 1 which comprises a carrier substrate 2, made of an opaque dielectric material, including an integrated network of electrical connections 3 and having a back face 4 and a front mounting face 5. The outline of the carrier substrate 2 is, for example, square or rectangular.

The package 1 comprises an electronic chip 6 mounted above the front face 5 of the carrier substrate 2 by way of a layer of adhesive 7 interposed between the front face 5 of the carrier substrate 2 and a back face 8 of the electronic chip 5.

The chip 6 is provided, in a front face 8, with an integrated optical element 9, such as a light radiation emitter and/or sensor.

The chip 6 is electrically connected to the connection network 2 by way of electrical wires 10 connecting pads of the front face of the carrier substrate 2 and front pads of the electrical connection network 2 formed on the front face of the chip 6, the back face 4 of the carrier substrate 2 being provided with electrical connection pads for external electrical connections.

The package 1 comprises an encapsulation cover 11 which is located above and at a distance from the chip 6, parallel to the carrier substrate 2, and which has an outline corresponding to that of the carrier substrate 2.

The cover 11 comprises a ring-shaped overmolded substrate 12 made of an opaque coating material, for example a thermosetting resin, which has opposite back and front faces 13 and 14, which are flat and parallel, and comprises an optical insert 15 in the form of a disc and the periphery of which is integrated and held within a through-passage 16 of the overmolded substrate 12. The optical insert 15 is made of a material that allows light radiation to pass through the substrate 11, from one face to the other, and is located facing the integrated optical element 9 of the chip 5. The optical insert 15 is, for example, made of glass, optionally optically treated glass, and has, for example, a square or rectangular outline. For example, the optical insert 15 has back and front faces 17 and 18 which extend substantially in the plane of the back and front faces 13 and 14 of the overmolded substrate 11.

The cover 11 is fixed above the carrier substrate 2 by way of an opaque local ring-shaped connecting spacer 19 interposed between a peripheral zone of the front face 5 of the carrier substrate 2 and a peripheral zone of the back face 13 of the overmolded substrate 12 of the cover 11, the ring-shaped bead 19 extending at a distance from the periphery of the chip 6 and the electrical connection wires 10 and at a distance from the periphery of the optical insert 15 of the cover 11.

The thickness of the ring-shaped spacer 19 determines the gap between the cover 10 and the carrier substrate 2. The ring-shaped spacer 19 may comprise an opaque adhesive including spacing balls which determine a minimum gap between the cover 10 and the carrier substrate 2.

Thus, the carrier substrate 2, the cover 11 provided with the optical insert 15 and the connecting bead 19 define a sealed chamber 20 in which the chip 6 and the electrical connection wires 10 are located. If the integrated optical element 9 of the chip 6 is a light radiation emitter, this light radiation is emitted outwards through the optical insert 15 of the cover 11. If the integrated optical element 9 of the chip 6 is a light radiation sensor, external light radiation reaches the integrated optical element 9 by passing through the optical insert 15 of the cover 11.

The cover 11 is the result of a wafer-scale manufacturing process which will now be described.

Figure 2:
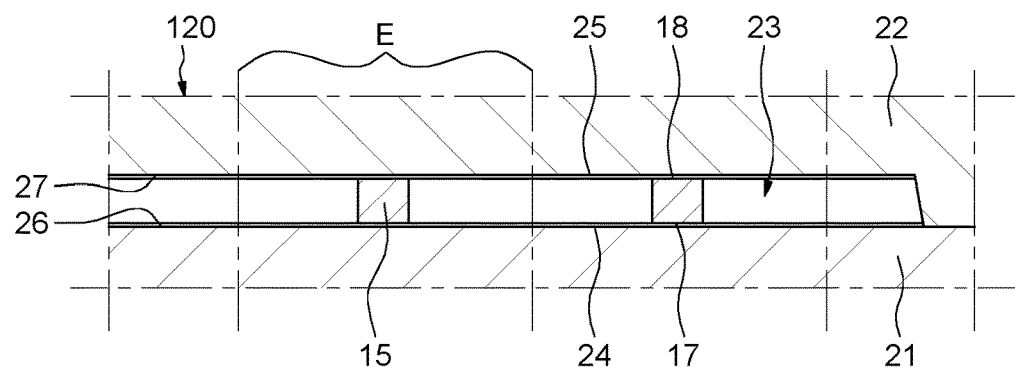
FIG. 2 shows a cross section of a mold for manufacturing a cover for the package of FIG. 1, in one manufacturing step.
Figure 3:
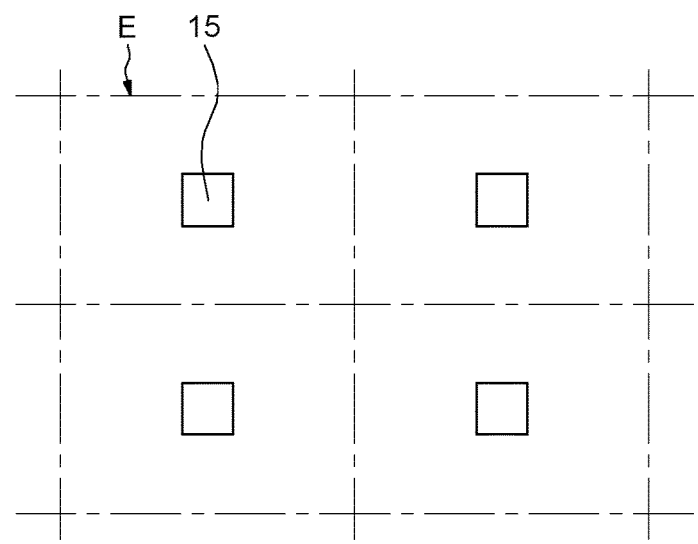
FIG. 3 shows a horizontal cross section of the mold of FIG. 2.

As illustrated in FIGS. 2 and 3, a mold 120 is obtained which comprises a lower part 21 and an upper part 22 between which a cavity 23 is formed. The parts 21 and 22 of the mold 120 have faces 24 and 25 which are opposite, flat and parallel, and which delimit the cavity 23 in the direction of the thickness of the covers 11 to be obtained. Optionally, these opposite faces 24 and 25 are covered with layers 26 and 27 made of a compressible material.

A plurality of optical inserts 15 is also obtained, resulting for example from cutting a substrate along parallel rows and parallel columns.

With the mold 120 open, optical inserts 15 are placed on the compressible layer 26, at respective locations in the sites E corresponding to covers 11 to be obtained, these sites E being adjacent and arranged in a square or rectangular matrix.

Next, the mold 120 is closed by placing the upper part 22 above the lower part 21. In this position, the opposite faces 17 and 18 of the optical inserts 15 are facing the opposite faces of the cavity 23 and are pressed against the compressible layers 26 and 27. Free spaces separate the optical inserts 15, these spaces straddling the rows and columns separating the adjacent sites E.

Figure 4:
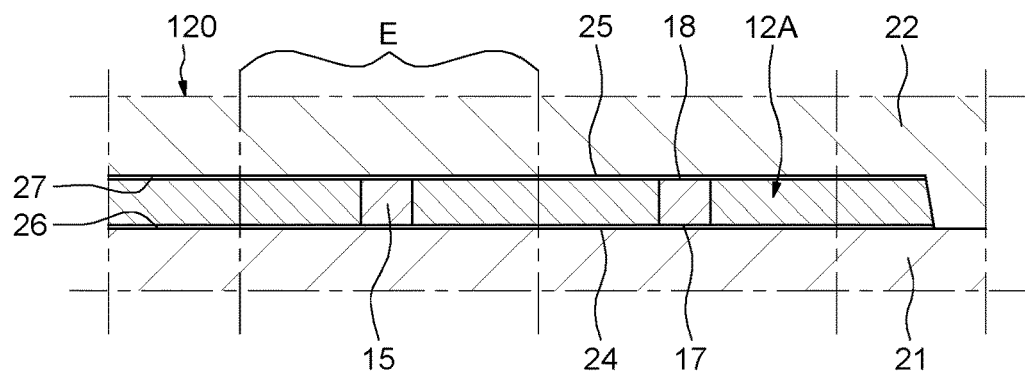
FIG. 4 shows a cross section of the manufacturing mold of FIG. 2, in another manufacturing step.

Next, as illustrated in FIG. 4, an opaque coating material, for example a thermosetting epoxy resin, is injected into the cavity 23 of the mold 120 and this coating material is set.

A collective substrate 12A, provided with optical inserts 15 and overmolded around these optical inserts 15 while forming through-passages 16, is obtained.

According to one variant embodiment, the collective substrate 12A is cut along the rows and columns delimiting the sites E in order to obtain covers 11.

Figure 5:
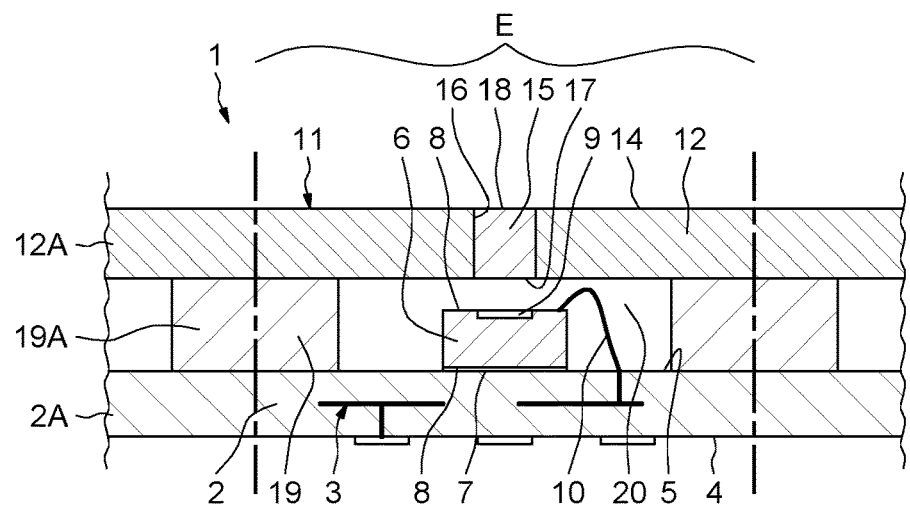
FIG. 5 shows a step of manufacturing the package of FIG. 1, in cross section.

According to another variant embodiment, as illustrated in FIG. 5, an opaque collective carrier substrate 2A is obtained which is provided, at sites E corresponding to electronic packages 1 to be obtained, with respective electronic connection networks 3 and which is provided, on its front face 5A, with electronic chips 6 at respective locations in the sites E and with electrical connection wires 10, these sites E being adjacent and arranged in a square or rectangular matrix.

Next, collective beads of opaque adhesive 19A are spread over the front face 5A of the collective carrier substrate 2A, along border zones between the sites E surrounding the central zones of the sites E in which the chips 6 are located, these collective beads 19A being intended to form spacers 19 at each site E.

Next, the overmolded collective substrate 12A, provided with the optical inserts 15, is placed on top of the beads of adhesive 19A and these beads of adhesive 19A are set so as to fix the collective substrate 12A above the collective carrier substrate 2A.

Next, the assembly formed is cut along rows and columns separating the sites E, perpendicularly to the substrates 2A and 12A and through the beads of adhesive 19A, between and at a distance from the optical inserts 15.

A plurality of electronic packages 1, produced at the sites E, is then obtained, in each one of which the carrier substrate 2 is a portion of the collective carrier substrate 2A, the cover 11 comprises an overmolded substrate 12 formed by a portion of the overmolded collective substrate 12A, including an optical insert 15, and the spacer 19 is formed by a portion of the collective beads of set adhesive 19A, the cover 11 resulting from the substrate 12 being overmolded around the optical insert 15.

According to one variant embodiment, the beads of adhesive 19A could be replaced by a grating made of a bonded rigid material, portions of this grating forming, after cutting, a spacer 19 at each site E.

Figure 6:
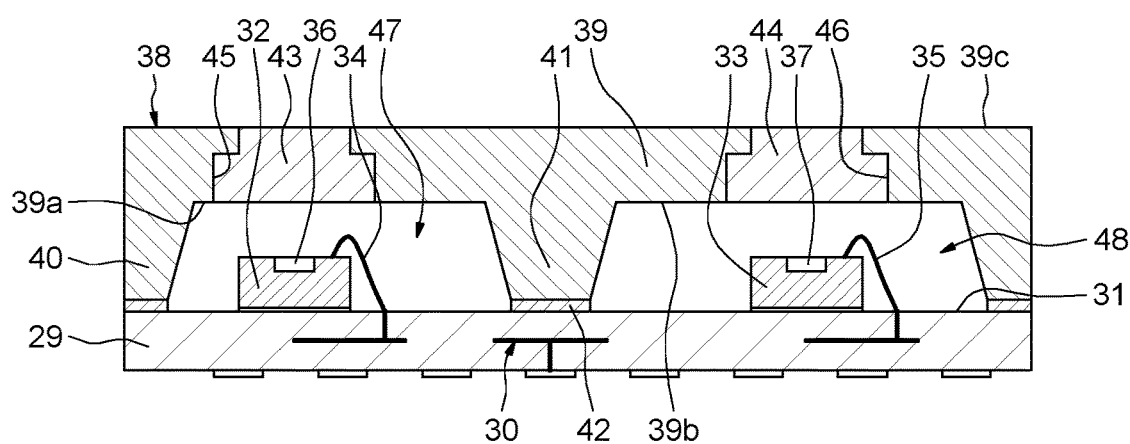
FIG. 6 shows a cross section of another electronic package.

FIG. 6 illustrates an electronic package 28, which differs from the electronic package 1 as follows.

The electronic package 28 comprises a carrier substrate 29 including an integrated network of electrical connections 30 and provided, on a front face 31, with two electronic chips 32 and 33 which are remote from one another, the chips 32 and 33 being connected to the electrical connection network 30 by electrical wires 34 and 35 and being provided with integrated front optical elements 36 and 37.

The electronic package 28 comprises an encapsulation cover 38 which comprises an overmolded substrate 39 extending in front of and at a distance from the chips 45 and 46 and provided, as one piece, with a protruding rear peripheral rib 40 and a rear inner rib 41, forming an internal partition.

The overmolded substrate 39 has back surfaces 39a and 39b which are circumscribed by the peripheral rib 40 and separated by the inner rib 41 and has a flat front surface 39c. The back surfaces 39a and 39b are parallel to the front surface 39c. The rear ends of the rear peripheral rib 40 and of the inner rib 41 extend in one and the same plane which is parallel to the overmolded substrate 39.

The flat rear end of the rear peripheral rib 40 extends above a peripheral zone of the front face 31 of the carrier substrate 29, at a distance from the chips 32 and 33 and electrical wires 34 and 35. The inner rib 41 passes between and at a distance from the chips 32 and 33. The flat rear end of the inner rib 41 extends above a medial zone of the front face 31 of the carrier substrate 29 located between and at a distance from the chips 32 and 33.

The encapsulation cover 38 is fixed above the carrier substrate 29 by way of local strips of opaque adhesive 42 interposed between the rear ends of the rear peripheral rib 40 and the inner rib 41 and the front face 31 of the carrier substrate 29.

The cover 38 additionally comprises optical inserts 43 and 44, allowing light to pass through, which inserts are integrated within through-passages 45 and 46 of the overmolded substrate 39 and located on either side of the intermediate rib 41 facing the optical elements 36 and 37 of the chips 32 and 33. The optical inserts 43 and 44 extend between the surfaces 39a and 39b on the one hand and the surface 39c of the overmolded substrate 39 on the other hand, respectively.

The carrier substrate 29 and the cover 38 delimit independent chambers 47 and 48 separated by an inner rib 41 and in which the chips 32 and 33 are located.

For example, the optical element 36 of the chip 32 may be a light radiation emitter emitting light radiation outwards through the optical insert 43 of the cover 38 and the optical element 37 of the chip 33 may be a light radiation sensor detecting external light radiation through the optical insert 44 of the cover 38. The electronic package 28 may constitute a means for detecting the proximity of a body by processing the signals arising from the sensor 37.

The cover 38 is the result of a wafer-scale manufacturing process which will now be described.

Figure 7:
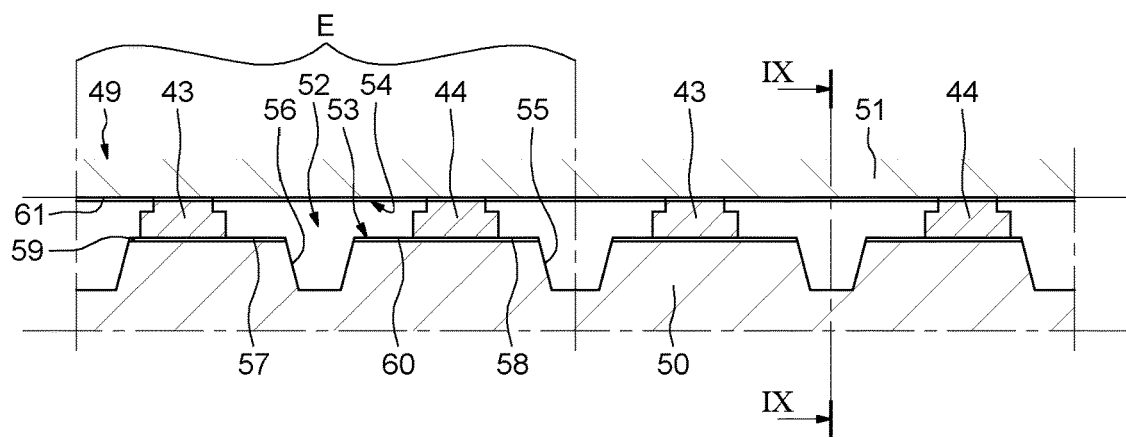
FIG. 7 shows a cross section of a mold for manufacturing a cover of the package of FIG. 6, along VII-VII as shown in FIG. 8, in one manufacturing step.
Figure 8:
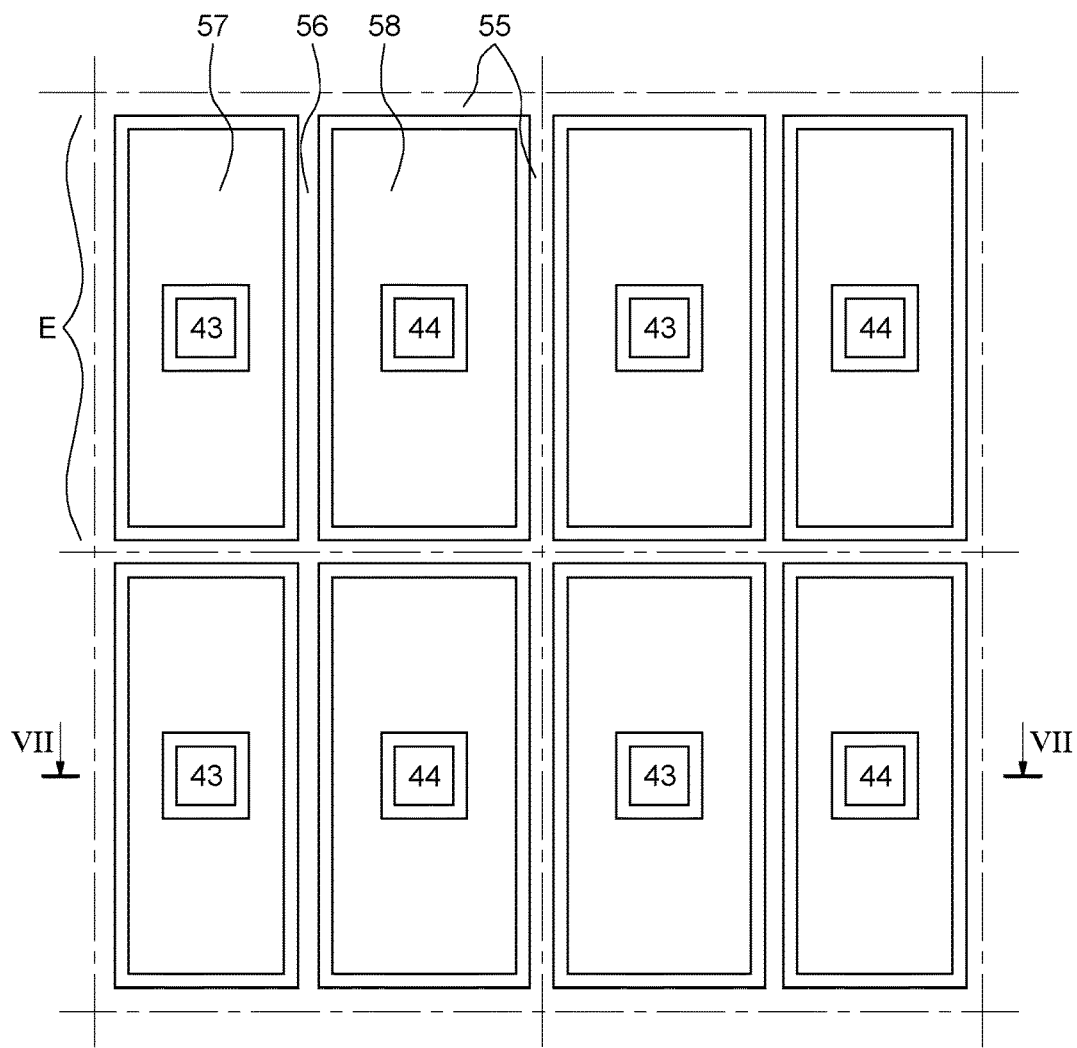
FIG. 8 shows a horizontal cross section of the mold of FIG. 7.
Figure 9:
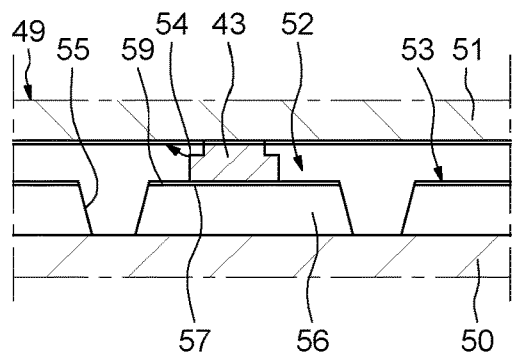
FIG. 9 shows a cross section of a manufacturing mold along IX-IX of FIG. 7.

As illustrated in FIGS. 7, 8 and 9, a mold 49 is obtained which comprises a lower part 50 and an upper part 51 between which a cavity 52 is formed. The parts 50 and 51 of the mold 49 have opposite faces 53 and 54 which delimit the cavity 23 in the direction of the thickness of the covers 11 to be obtained.

The face 53 of the lower part 50 of the mold 49 has adjacent sites E arranged in a matrix, corresponding to covers 38 to be obtained. The face 53 has cross-shaped main grooves 55 through the middles of which pass the rows and columns of the matrix forming the sites E and, at each site E, an intermediate groove 56 that is parallel to the rows of the matrix and joins up with the grooves 55 located on either side of the site E.

Thus, at each site E, the face 53 of the lower part 50 of the mold 49 comprises flat zones 57 and 58 which are circumscribed by corresponding portions of the grooves 55 and separated by a corresponding intermediate groove 56. The flat zones 57 and 58 extend in one and the same plane. The grooves 55 and 56, which have a U-shaped cross section, have the same depth with respect to the flat zones 57 and 58. According to one variant embodiment, the flat zones 57 and 58 could extend in different planes.

The face 54 of the upper part 51 of the mold 49 is flat and parallel to the zones 57 and 58 of the lower part 50 of the mold 49.

Optionally, the faces 57 and 58 of the lower part 50 of the mold 49 and the face 54 of the upper part 51 of the mold 49 are covered with layers 59, 60 and 61 made of a compressible material.

A plurality of optical inserts 43 and 44 is also obtained.

With the mold 49 open, optical inserts 43 and 44 are placed on the compressible layers 59 and 60 of the lower part 50, at respective locations at the sites E corresponding to covers 38 to be obtained.

Next, the mold 49 is closed by placing the upper part 51 above the lower part 21, on the optical inserts 43 and 44. In this position, the opposite faces of the optical inserts 43 and 44 are pressed against the compressible layers 59 and 60 on the one hand and against the compressible layer 61 on the other hand.

Figure 10:
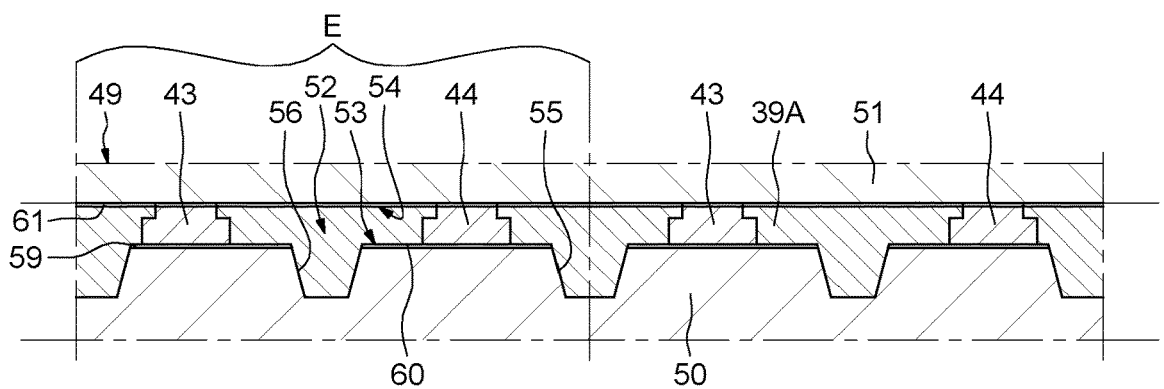
FIG. 10 shows a cross section of the manufacturing mold of FIG. 7, in another manufacturing step.

Next, as illustrated in FIG. 10, an opaque coating material, for example a thermosetting epoxy resin, is injected into the cavity 52 of the mold 49 and this coating material is set.

A collective substrate 39A is obtained which is ribbed on one side at the locations of the grooves 55 and 56 and provided with optical inserts 43 and 44, which inserts are integrated and held within the coating material forming the collective substrate 39A, the latter being overmolded around the optical inserts 43 and 44 while forming through-passages 45 and 46.

According to one variant embodiment, the collective substrate 39A is cut along the rows and columns delimiting the sites E in order to obtain covers 38.

Figure 11:
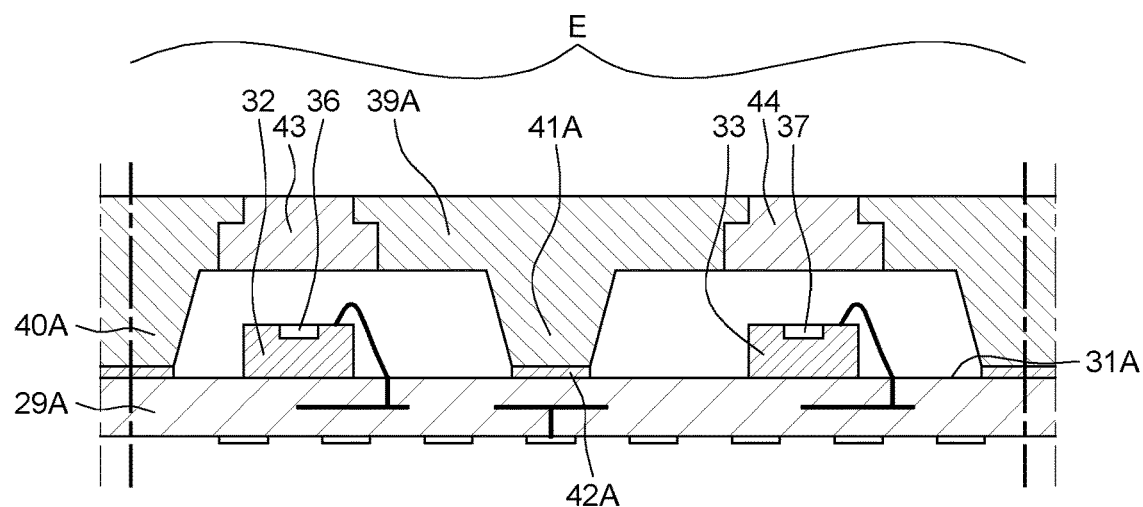
FIG. 11 shows a step of manufacturing the package of FIG. 6, in cross section.

According to another variant embodiment, as illustrated in FIG. 11, an opaque collective carrier substrate 29A is obtained which is provided, at sites E corresponding to electronic packages 1 to be obtained, with respective electronic connection networks 30 and which is provided, on its front face 31A, with electronic chips 32 and 33 at respective locations at the adjacent sites E and with electrical wires 34 and 35.

Next, collective strips of opaque adhesive 42A are spread over the front face 31A of the collective carrier substrate 29A at each site E with a view to forming the strips of adhesive 42 of the packages 28 to be obtained.

Next, the overmolded collective substrate 39A, provided with optical inserts 15, is placed on top of the collective strips of adhesive 42A, and this adhesive 19A is set so as to fix the collective substrate 39A above the collective carrier substrate 29A.

Next, the assembly formed is cut along rows and columns separating the sites E, perpendicularly to the substrates 29A and 39A and through the ribs 40A, in the direction of their length and dividing them in two in order to form the rear peripheral rib 40, and through the corresponding strips of hardened adhesive 42A.

A plurality of electronic packages 28, produced at the sites E, is then obtained, the cover 38 resulting from the substrate 39 being overmolded around the optical inserts 43 and 44.

Figure 12:
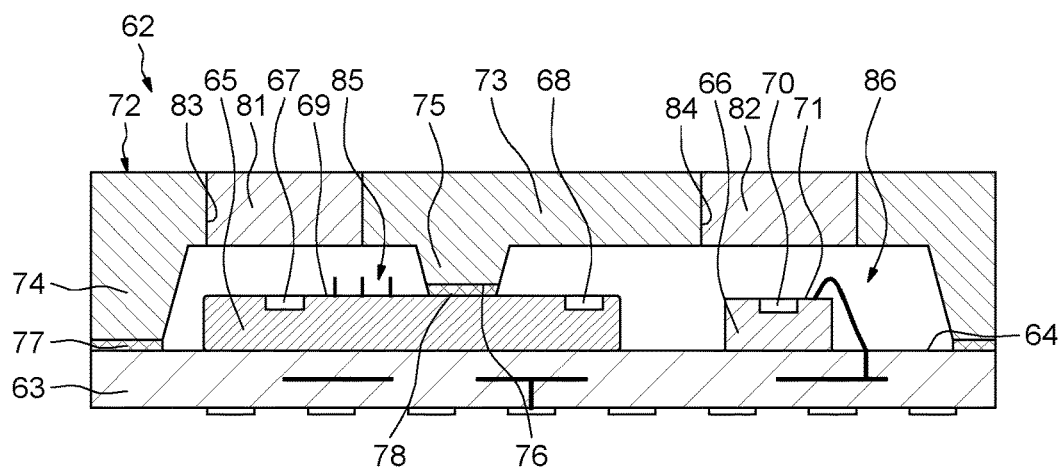
FIG. 12 shows a cross section of another electronic package.
Figure 13:
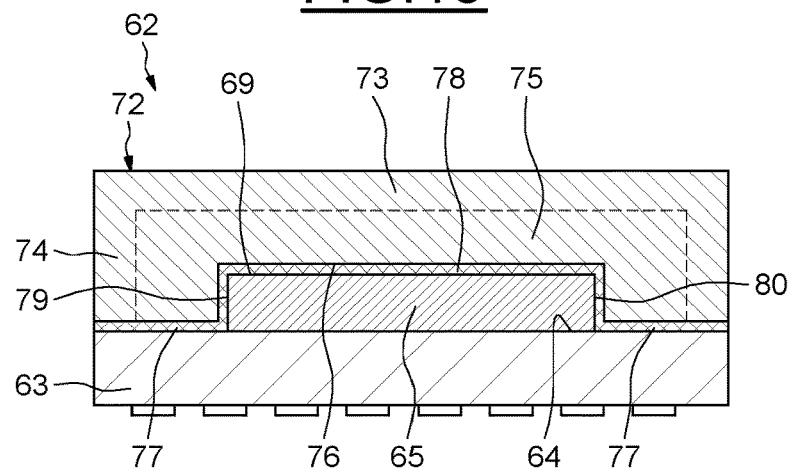
FIG. 13 shows a cross section of the package of FIG. 12 along XIII-XIII.

FIGS. 12 and 13 illustrate an electronic package 62 which differs from the electronic package 28 solely in the following arrangements.

In the same way as for the electronic package 28, the electronic package 62 comprises an opaque carrier substrate 63 which is provided, on its front face 64, with two electronic chips 65 and 66 which are remote from one another and bonded to the front face 64.

This time, the chip 65 comprises two front optical elements 67 and 68 integrated within its front face 69 and the chip 66 comprises, as above, a front optical element 70 in its front face 71. The front optical elements 67, 68 and 70 are aligned.

In the same way as for the electronic package 28, the electronic package 62 comprises an encapsulation cover 72 which comprises an overmolded opaque front substrate 73 provided with a protruding peripheral rear rib 74 and a protruding rear inner rib 75, forming a partition.

This time, instead of being located between the chips 65 and 66, the rear inner rib 75 straddles the chip 65, passing over the front face 69 and between and at a distance from the front optical elements 67 and 68 of the chip 65. For this purpose, the rear inner rib 75 has a notch 76 through which the chip 65 passes.

The encapsulation cover 72 is fixed above the carrier substrate 63 by way of local strips of opaque adhesive 77 interposed between the front face 64 of the carrier substrate 63 on the one hand and the flat rear ends of the rear peripheral rib 74 and parts of the rear inner rib 75 located on either side of the chip 65 on the other hand, and by way of a local strip of opaque adhesive 78 interposed between the front face 64 and the sides 79 and 80 of the chip 65 on the one hand and the flat faces of the notch 76 of the inner rear rib 75 on the other hand.

The cover 72 additionally comprises optical inserts 81 and 82, allowing light to pass through, which inserts are integrated within through-passages 83 and 84 of the substrate 73 overmolded around optical inserts 81 and 82. The optical inserts 81 and 82 are located on either side of the intermediate rib 75 and facing the optical element 67 of the chip 65 and facing the optical element 70 of the chip 66, respectively.

Thus, the carrier substrate 63 and the cover 72 delimit chambers 85 and 86, separated by the inner rib 75, such that the optical element 67 of the chip 65 is located within the chamber 81 on the one hand, and the optical element 68 of the chip 65 and the optical element 70 of the chip 66 are located within the chamber 82 on the other hand.

According to one mode of operation, the optical elements 67 and 68 of the chip 65 are light radiation sensors and the optical element 70 of the chip 66 is a light radiation emitter. The emitter 70 of the chip 66 emits light radiation outwards through the optical insert 82. This light radiation present in the chamber 86 is detected by the sensor 68 of the chip 65. The sensor 67 of the chip 65 detects external light radiation through the optical insert 81. The electronic package 62 may constitute a means for detecting the proximity of a body by processing the signals arising from the sensors 67 and 68.

The cover 72 is the result of a wafer-scale manufacturing process equivalent to that described above with reference to FIGS. 7 to 10.

Figure 14:
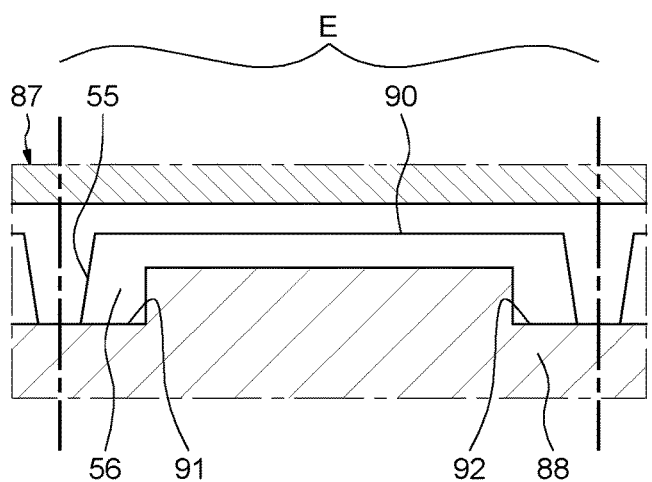
FIG. 14 shows a cross section of a mold for manufacturing the cover of the package of FIG. 12.

For this purpose, as illustrated in FIG. 14, a mold 87 equivalent to the mold 49 is obtained. The lower part 88 is provided with cross-shaped main grooves 55 and intermediate grooves 56 which, this time, have a respective central part 90 which is shallower than the end parts 91 and 92 located on either side of this central part, this central part allowing the notch 76 to be made.

The cover 72 is mounted on the carrier substrate in the same way as that which has been described above with reference to FIG. 11.

However, before putting the cover 72 into place, a strip of adhesive in liquid or paste form is deposited on the chip 65, in order to form the local strip of opaque adhesive 78.

The invention claimed is:

1. An electronic package, comprising:
   a carrier substrate;
   a first electronic chip having a back face fixed to a front mounting face of the carrier substrate and having a front face including at least one integrated optical element; and
   an encapsulation cover over said first electronic chip, said encapsulation cover comprising a substrate that is overmolded around a first optical insert configured to allow light radiation to pass from one side of the overmolded substrate to another side of the overmolded substrate, wherein said overmolded substrate is provided with a ring-shaped rib surrounding said first electronic chip at a distance,
   wherein said encapsulation cover is fixed at least above said mounting face of said carrier substrate in a position such that the encapsulation cover extends above the first electronic chip, the encapsulation cover being fixed above said carrier substrate by way of an adhesive mounting said ring-shaped rib.

2. The package according to claim 1, wherein the adhesive is an annular bead of adhesive interposed between a peripheral zone of the carrier substrate and a peripheral zone of said overmolded substrate.

3. The package according to claim 1, wherein the adhesive is an annular strip of adhesive interposed between a peripheral zone of the carrier substrate and a peripheral zone of said overmolded substrate.

4. The package according to claim 1, wherein said overmolded substrate is further provided with an intermediate rib delimiting two chambers, and wherein the adhesive is a strip of adhesive mounting said intermediate rib of the encapsulation cover above said carrier substrate.

5. The package according to claim 4, wherein said first electronic chip is located within one of said two chambers and further comprising a second electronic chip located within another of said two chambers.

6. The package according to claim 4, wherein said first electronic chip extends through a notch of said intermediate rib, and wherein the adhesive fixes the intermediate rib on said first electronic chip.

7. The package according to claim 6, wherein said first electronic chip includes a first optical sensor within one of said two chambers and a second optical sensor within another of said two chambers.

8. The package according to claim 7, further including a second electronic chip provided with an optical transmitter within said another of said two chambers.

9. The package according to claim 4, wherein said first optical insert is located on one side of said intermediate rib and further including a second optical insert located on another side of said intermediate rib.

10. The package according to claim 1, wherein opposite faces of the first optical insert are coplanar with one side and another side of said overmolded substrate.

11. The package according to claim 1, wherein said overmolded substrate is made of an opaque material.

12. The package according to claim 1, wherein an outer surface of the ring-shaped rib is a cut surface.

* * * * *